United States Patent [19]

Chiao et al.

[11] 4,302,667
[45] Nov. 24, 1981

[54] NEAR MILLIMETER BISTABLE DEVICE

[75] Inventors: Raymond Y. Chiao, Kensington, Calif.; Harold R. Fetterman, Lexington, Mass.; Howard R. Schlossberg, Annandale, Va.

[73] Assignee: The United States of America as represented by the Secretary of the Air Force, Washington, D.C.

[21] Appl. No.: 85,663

[22] Filed: Oct. 17, 1979

[51] Int. Cl.³ .............................................. G01J 1/32
[52] U.S. Cl. ................................................ 250/205
[58] Field of Search ....................... 250/201, 205, 216

[56] References Cited

U.S. PATENT DOCUMENTS 4,092,530 5/1978 Wise ................................... 250/205

OTHER PUBLICATIONS

"Far-I.R. Heterodyne Radiometric Measurements with Quasi-Optical Schottky Diode Mixers" by Fetterman et al., Appl. Phys. Lett., Jul. 1978, pp. 151–154.

*Primary Examiner*—David C. Nelms
*Attorney, Agent, or Firm*—Donald J. Singer; Jacob N. Erlich

[57] ABSTRACT

A near millimeter bistable device having a source of electromagnetic radiation in optical alignment with a variable reflecting means in the form of a Schottky barrier diode corner cube assembly. Interposed between the radiation source and the variable reflecting means is a beam splitter which reflects a beam of energy from the variable reflecting means through another beam splitter to a detector. The voltage produced by the detector is fed through a feedback circuit back to the variable reflecting means in order to vary the reflectivity thereof. In this manner the output of the device emanating from the other beam splitter has two stable conditions, one of relatively high output power and one of relatively low output power.

7 Claims, 1 Drawing Figure

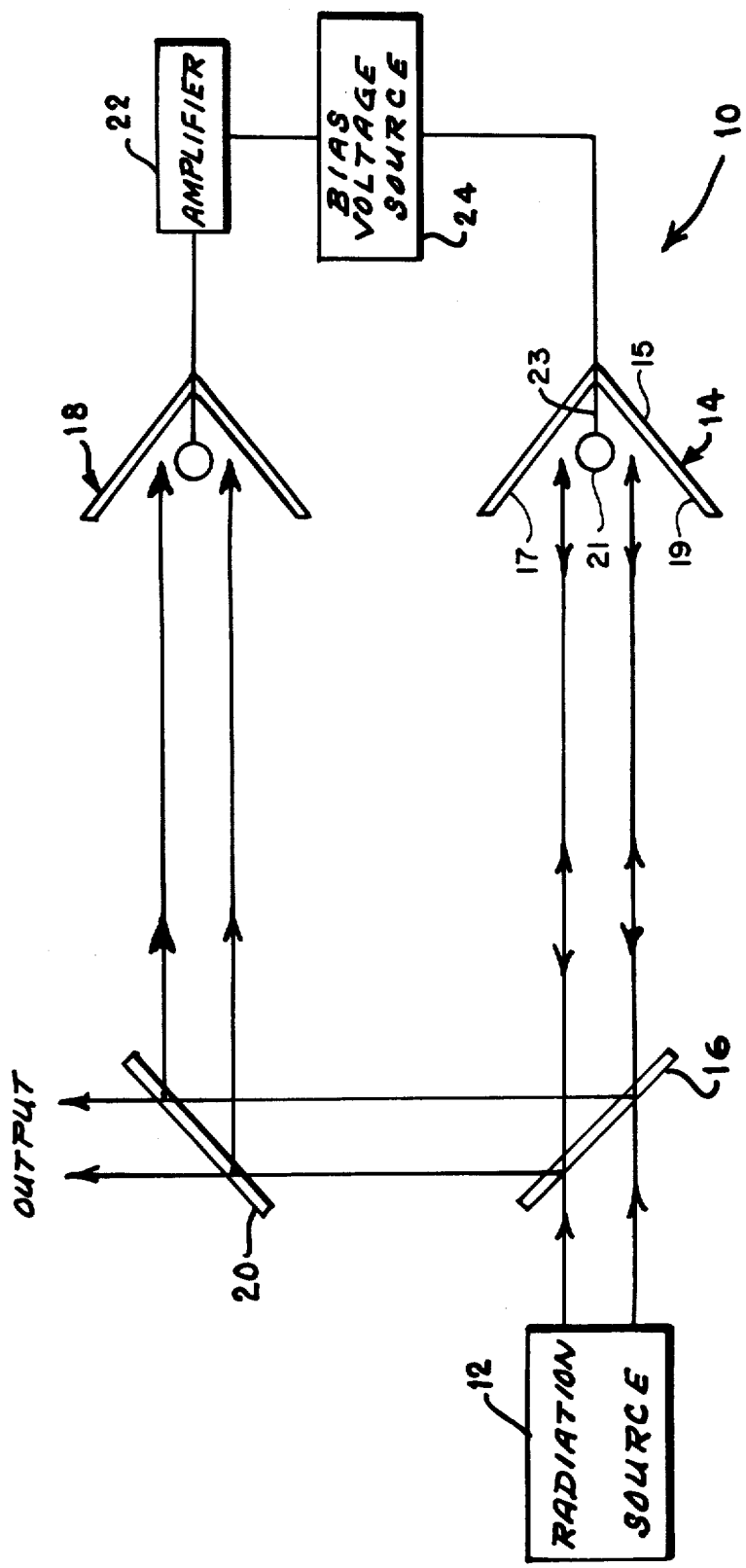

NEAR MILLIMETER BISTABLE DEVICE

STATEMENT OF GOVERNMENT INTEREST

The invention described herein may be manufactured and used by or for the Government for governmental purposes without the payment of any royalty thereon.

BACKGROUND OF THE INVENTION

This invention relates generally to bistable devices, and, more particularly, to a bistable device capable of effective operation within the near millimeter and submillimeter wavelength regions.

Bistable devices have been found to have great utility in a number of already existing systems which include modulators or other devices utilizing switches, latches or logical operations. Heretofore, bistable devices have operated in the optical wavelength region and were generally divided into three classes; those which employed a nonlinear optical medium, hybrid devices in which an "artificial nonlinearity" is created by detecting the transmitted power of a resonator and feeding the signal back to an internal electro-optic element and a new class of hybrid multistable optical devices which do not require a resonator and are fully described in a paper entitled Incoherent Mirrorless Bistable Optical Devices by E. Garmire et al, Applied Physics Letters, Volume 32 (5), Mar. 1, 1978, pgs 320 and 321.

An ever expanding wavelength region of interest is the submillimeter and nearmillimeter wavelength regions such as produced by a $CO_2$ optically pumped laser used in reconnaissance, communications, radar, imaging systems, pollution detection devices, frequency standards, and spectroscopy. Unfortunately, the bistable devices, as listed above, are not readily adaptable for use with systems in the submillimeter or near millimeter wavelength regions. Consequently, with the increased applicability of the this wavelength region, it has become increasingly necessary to provide bistable devices which are effective.

SUMMARY OF THE INVENTION

This invention provides a device which leads to bistability in the reflected power for a range of values of input power in the submillimeter or near millimeter wavelength range and therefore overcomes the problems associated with the bistable devices of the past.

The bistable device, of this invention, is made up of a variable reflecting element which takes the form of a Schottky diode corner cube reflector assembly of the type described in an article entitled "Far-ir heterodyne radiometric measurements with guasioptical Schottky diode mixers" by H.R. Fetterman et al published in the Applied Physics Letters, 33 (2), July 15, 1978, pps 151-154, optically aligned with an input beam of radiation of a preselected wavelength in the near millimeter or submillimeter wavelength range. This power source may be in the form of any suitable $CO_2$ optically pumped laser. Optically interposed between the laser source and the variable reflecting means is a first directing element in the form of, for example, a beam splitter which allows the input power to be transmitted through the beam splitter to the variable reflecting means. In addition, the beam splitter also directs the power which is reflected off the variable reflecting means to a suitable detector. Interposed between the first beam splitter and the detector is a second beam splitter which allows a portion of the reflected power to be directed towards the detector while the remaining reflected power is output from the bistable device of this invention.

Operably connected to the detector is any suitable amplifier. Electrically connected to the amplifier is a suitable bias voltage source which is in turn connected to the variable reflecting means described above. The above elements constitute a feedback circuit for the bistable device of this invention. Consequently, the output voltage of the detector is amplified and utilized as a signal which is fed back to change the bias of the variable reflecting means. By the utilization of a Schottky diode corner cube assembly as the variable reflecting element of the bistable device of this invention, this invention is capable of reliable operation in two stable conditions in the near millimeter and submillimeter wavelength region.

It is therefore an object of this invention to provide a bistable device capable of use in the near millimeter and sub millimeter wavelength region.

It is another object of this invention to provide a near millimeter bistable device which is economical to produce and which utilizes conventional, currently available components, that lend themselves to standard mass producing manufacturing techniques.

For a better understanding of the present invention together with other and further objects thereof, reference is now made to the following description taken in conjunction with the accompanying drawing and its scope will be pointed out in the appended claims.

DETAILED DESCRIPTION OF THE DRAWING

The only FIGURE of this drawing is a schematic representation of the near millimeter bistable device of this invention.

DETAILED DESCRIPTION OF THE PREFERRED EMBODIMENT

Reference is now made to the only FIGURE of the drawing which clearly illustrates in schematic fashion the near millimeter bistable device 10 of this invention. Bistable device 10 is generally utilized with any suitable electromagnetic radiation source 12 such as a $CO_2$ optically pumped laser which is, preferably, in this invention in the near millimeter or submillimeter wavelength region. (100 GHz-3000 GHz). An essential element of the bistable device 10 of this invention is in the form of a variable reflecting element 14 optically aligned with the beam of radiation emitted from laser source 12. Variable reflecting element 14 is preferably in the form of a Schottky barrier diode corner cube reflector assembly of the type described in the publication entitled "Far-ir heterodyne radiometric measurement with quasioptical Schottky diode mixers", H. R. Fetterman et al, Applied Physics Letters, 33 (2), July 15, 1978, pps 151-154.

More specifically, corner cube assembly 14 is made up of a reflector 15 having a pair of reflecting surfaces 17 and 19, a Schottky barrier diode 21 operable in the near millimeter or submillimeter wavelength region and an antenna wire 23.

Optically interposed between radiation source 12 and Schottky barrier diode assembly 14 is a conventional directing element 16 in the form of, for example, a conventional beam splitter. Beam splitter 16 is situated so as to accept and direct an incoming beam of near millimeter radiation through to Schottky barrier diode 14 as well as to redirect the power reflected from Schottky barrier diode assembly 14. This reflected power represents the output of bistable device 10 as well as a signal which is received by a conventional detector 18 in the form of another Schottky barrier diode corner cube assembly or bolometer.

Detector 18 is optically aligned with the reflected power from Schottky barrier diode 14. This is accomplished by means of another directing means 20 in the form of another beam splitter which is optically aligned with beam splitter 16. Beam splitter 20 allows for a portion of the beam to pass therethrough as the output power of device 10 while directing the other portion of the reflected power toward detector 18.

Electrically connected to detector 18 is any conventional feedback amplifier 22 and a bias voltage source 24. Additionally, feedback amplifier 22 and voltage source 24 are connected to Schottky barrier diode 14 completing the feedback circuit of the bistable device of this invention. The amount of reflectivity of Schottky barrier diode corner cube assembly 14 is determined by the voltage applied thereto as evidenced by the following equation:

$$\rho(V) = \frac{Z_o - R(V)}{Z_o + R(V)} = \frac{P_{ref}}{P_{inc}} \qquad (1)$$

where $\rho(V)$ = voltage reflection coefficient
$Z_o$ = characteristic impedance of the diode system
$R(V)$ = variable resistance of Schottky diode 14 as a function of voltage
$P_{ref}$ = reflected power of system
$P_{inc}$ = input power of system The amount of voltage is in direct proportion to the power of the reflected beam incident upon detector 18 as evidenced by the flowing equation:

$$aP_{ref} = V_B + V \qquad (2) \text{ PS}$$

where a = the product of the voltage responsivity of detector 18, the gain of amplifier 22 and the coupling coefficient determined by beam splitters 16 and 20
$P_{ref}$ = output power of system
$V_B$ = bias voltage
V = voltage on Schottky diode 14 from amplifier 22

Increasing the voltage on Schottky barrier diode 14 increases the reflectivity thereof and therefore the eventual power output from the bistable device 10 of this invention This power is increased until a first stable condition is reached at which the reflectivity of Schottky barrier diode 14 increases no further. The bistable device 10 is now in a high-reflectivity state. If the power is now decreased the device 10 stays in a high reflectivity state until the feedback system can no longer maintain such a state. Thereupon the reflectivity of Schottky barrier diode 14 switches to a second stable condition of low reflectivity. Due to feedback, the bistable device 10 is maintained in a low reflectivity state until the power is increased and switches devices 10 into the high reflectivity state. Device 10 of this invention is therefore truly bistable with high and low reflectivity states. The particular state in which the device 10 is in depends uoon its previous history.

This bistability in the near millimeter of submillimeter wavelength region allows for the reliable use of the bistable device 10 of this invention within many latching or switching systems in which operation in the near millimeter or submillimeter wavelength region is desirable. It is possible with this invention, for example, to produce with an input of 1.5 mW, an output in the low reflectivity state or low power condition 0.1 mW of power and in the high reflectivity state or high power condition 1 mW of power.

Although this invention has been described with reference to a particular embodiment, it will be understood to those skilled in the art, that this invention is also capable of further and other embodiments within the spirit and scope of the appended claims.

We claim:

1. A near millimeter wavelength bistable device comprising means for producing a beam of electromagnetic radiation at near millimeter wavelength at a preselected power, means in optical alignment with said radiation producing means for variably reflecting said beam of radiation, first means optically interposed between said radiation producing means and said variable reflecting means for directing said beam of electromagnetic radiation to said variable reflecting means and for reflecting said reflected beam from said variable reflecting means away therefrom, second means optically aligned with said reflected beam from said first directing and reflecting means for directing a portion of said reflected beam out of said bistable device as an output and reflecting the remaining portion away therefrom, means optically aligned with said remaining portion of said beam from said second directing and reflecting means for detecting said remaining portion of said reflected beam of electromagnetic radiation and providing a voltage in accordance with the power of said reflected beam of radiation, and means electrically connected between said detecting means and said variable reflecting means for providing a signal in accordance with said voltage produced by said detecting means to said variable reflecting means for altering the reflectivity of said variable reflecting means whereby said output produced by said bistable device has two stable conditions, one of said stable conditions being at a relatively high output power and the other of said stable conditions being at a relatively low output power.

2. A near millimeter wavelength bistable device as defined in claim 1 wherein said variably reflecting means is in the form of a Schottky barrier diode corner cube assembly.

3. A near millimeter wavelength bistable device as defined in claim 2 wherein said means electrically connected between said detecting means and said Schottky barrier diode corner cube assembly is a feedback circuit.

4. A near millimeter wavelength bistable device as defined in claim 3 wherein said first and second directing and reflecting means are a pair of beam splitters, respectively.

5. A near millimeter wavelength bistable device as defined in claim 4 wherein said feedback circuit comprises an amplifier and a bias voltage source.

6. A near millimeter wavelength bistable device as defined in claim 5 wherein said detecting means is in the form of a Schottky barrier diode corner cube assembly.

7. A near millimeter wavelength bistable device as defined in claim 6 wherein said preselected power is approximately 1.5 mW, said high output power is approximately 1 mW and said low output power is approximately 0.1 mw.

* * * * *